(12) United States Patent
Kim (10) Patent No.: US 11,183,533 B2
(45) Date of Patent: Nov. 23, 2021

(54) METHOD FOR MANUFACTURING CURVED-SURFACE DETECTOR, AND CURVED-SURFACE DETECTOR MANUFACTURED USING THE MANUFACTURING METHOD

(71) Applicant: TOVIS CO., LTD., Incheon (KR)

(72) Inventor: Yong Beom Kim, Incheon (KR)

(73) Assignee: TOVIS CO., LTD., Incheon (KR)

( * ) Notice: Subject to any disclaimer, the term of this patent is extended or adjusted under 35 U.S.C. 154(b) by 0 days.

(21) Appl. No.: 16/763,233

(22) PCT Filed: Nov. 5, 2018

(86) PCT No.: PCT/KR2018/013288
§ 371 (c)(1),
(2) Date: May 12, 2020

(87) PCT Pub. No.: WO2019/093722
PCT Pub. Date: May 16, 2019

(65) Prior Publication Data
US 2021/0074760 A1   Mar. 11, 2021

(30) Foreign Application Priority Data
Nov. 13, 2017   (KR) .................. 10-2017-0150538

(51) Int. Cl.
*H01L 27/146*   (2006.01)
(52) U.S. Cl.
CPC .. *H01L 27/14698* (2013.01); *H01L 27/14663* (2013.01); *H01L 27/14685* (2013.01)

(58) Field of Classification Search
CPC ......... H01L 27/14698; H01L 27/14663; H01L 27/14685; H01L 31/0392; H01L 31/048;
(Continued)

(56) References Cited

U.S. PATENT DOCUMENTS 4,734,588 A * 3/1988 Akai ..................... G01T 1/2018
250/366
5,510,273 A * 4/1996 Quinn ................... H01L 25/042
156/160

(Continued)

FOREIGN PATENT DOCUMENTS

| JP | 01-126584 A | 5/1989 |
| JP | 2004-361402 A | 12/2004 |

(Continued)

OTHER PUBLICATIONS

International Search Report for PCT/KR2018/013288 dated Apr. 11, 2019 from Korean Intellectual Property Office.

*Primary Examiner* — Bitew A Dinke
(74) *Attorney, Agent, or Firm* — Revolution IP, PLLC (57) ABSTRACT

A method of manufacturing a curved-surface detector includes: slimming a sensor substrate having photoelectric devices arranged therein to a predetermined thickness; seating the sensor substrate slimmed to the predetermined thickness on a jig curved so as to have a curved-surface shape such that the sensor substrate is curved so as to have a curved-surface shape; and joining a flexible scintillator substrate configured to emit light when being struck by radiation to an upper surface of the sensor substrate such that curvature of the sensor substrate curved so as to have a curved-surface shape by the jig is maintained.

9 Claims, 5 Drawing Sheets

(58) Field of Classification Search
CPC ... H01L 31/08; H01L 31/18; H01L 27/14812; H01L 21/823406; Y02P 70/50; Y02E 10/50
See application file for complete search history.

(56) References Cited

U.S. PATENT DOCUMENTS

| | | | |
|---|---|---|---|
| 7,507,944 B1* | 3/2009 | Arnzen | H01L 27/14603 250/208.1 |
| 2001/0020671 A1* | 9/2001 | Ansorge | H01L 27/1462 250/208.1 |
| 2004/0016886 A1* | 1/2004 | Ringermacher | H01L 27/14601 250/370.11 |
| 2004/0238750 A1* | 12/2004 | Vafi | G01T 1/2018 250/370.11 |
| 2006/0256922 A1* | 11/2006 | Imai | A61B 6/032 378/116 |
| 2009/0261259 A1* | 10/2009 | Yip | G01T 1/2018 250/370.09 |
| 2012/0037809 A1* | 2/2012 | Levene | G01T 1/2985 250/370.08 |
| 2016/0020129 A1* | 1/2016 | Farrens | B32B 5/142 428/201 |
| 2016/0204164 A1* | 7/2016 | Zhao | G01T 1/2018 250/369 |
| 2016/0358971 A1* | 12/2016 | Gaeremynck | G01J 4/228 |
| 2016/0370303 A1* | 12/2016 | Schmitz | G01N 23/083 |

FOREIGN PATENT DOCUMENTS

| | | | |
|---|---|---|---|
| JP | 2012-059913 A | 3/2012 | |
| KR | 10-0278479 B1 | 2/2001 | |
| KR | 10-2014-0056670 A | 5/2014 | |
| WO | WO-2011148960 A1 * | 12/2011 | ............. G03B 42/02 |

* cited by examiner

METHOD FOR MANUFACTURING CURVED-SURFACE DETECTOR, AND CURVED-SURFACE DETECTOR MANUFACTURED USING THE MANUFACTURING METHOD

TECHNICAL FIELD

The present invention relates to a curved-surface detector curved so as to have a curved surface in order to capture a radiographic image.

BACKGROUND ART

In general, X-ray or computed tomography (CT) applies radiation to a human body to acquire a radiographic image based on transmittance of the radiation, whereby it is possible to determine whether the human body is abnormal without confirmation of the interior of the human body through surgery.

In the case of CT, radiation is transmitted through a portion of the human body in order to acquire an image in the form of a section. In the case of X-ray, radiation is transmitted through the entirety of the human body, whereby X-ray is less accurate than CT. Since expenses related to X-ray equipment are low, however, X-ray is preferably used in the case in which abnormality of the human body is simple.

In the case of X-ray, a radiographic image is captured using a photosensitive film, such as a photograph, and the photosensitive film is developed to confirm the image. However, the development process is complicated and takes a long time. In recent years, therefore, an X-ray detector capable of directly transmitting a captured radiographic image to a computer in order to confirm the image instead of using the photosensitive film has been proposed, which is disclosed in Korea Registered Patent Publication No. 10-0278479 (published on Feb. 1, 2001).

The conventional X-ray detector includes a gate pad connected to the ends of gate lines arranged in rows on a substrate, a data pad connected to the ends of data lines arranged in columns, switching devices arranged at the portions at which the gate lines and the data lines intersect each other, and a scanning and data integrated circuit chip configured to drive the switching devices, and is manufactured through the steps of forming protrusion electrodes at the scanning and data integrated circuit chip, providing a polyimide film, forming first and second lead electrodes, each of which has an inner lead electrode located on the polyimide film and an outer lead electrode located outside the polyimide film, connecting the gate pad and the data pad to the outer lead electrodes of the first and second lead electrodes, and connecting the inner lead electrodes of the first and second lead electrodes to the protrusion electrodes of the scanning and data integrated circuit chip.

In the above X-ray detector, a time incurred to perform a process of connection between an X-ray detector panel and a drive integrated circuit is shortened, connection between connection terminals within a small distance is possible, and connection area is also reduced, whereby the X-ray detector has a compact structure.

Although the majority of the human body is curved in structure, however, radiation is emitted from a radiation source in the form of a dot and is then applied to the conventional X-ray detector, whereby a captured radiographic image is enlarged and thus distorted.

DISCLOSURE

Technical Problem

The present invention has been made in view of the above problems, and it is an object of the present invention to provide a curved-surface detector that is curved so as to have a curved surface in response to the curvature of a human body, is relatively easy to manufacture, and is manufactured at low cost.

Technical Solution

A method of manufacturing a curved-surface detector according to an embodiment of the present invention to accomplish the above object is a method of manufacturing a curved-surface detector in which a detector configured to convert radiation into an electrical signal in order to acquire a radiographic image is curved so as to have a curved-surface shape, the method including slimming a sensor substrate having photoelectric devices arranged therein to a predetermined thickness, seating the sensor substrate slimmed to the predetermined thickness on a jig curved so as to have a curved-surface shape such that the sensor substrate is curved so as to have a curved-surface shape, and joining a flexible scintillator substrate configured to emit light when being struck by radiation to an upper surface of the sensor substrate such that curvature of the sensor substrate curved so as to have a curved-surface shape by the jig is maintained, wherein the scintillator substrate is joined to the sensor substrate via a junction layer in the state of being curved at curvature identical to curvature of the sensor substrate in order to maintain the curvature of the sensor substrate and thus to prevent separation between the scintillator substrate and the sensor substrate or deformation of the scintillator substrate and the sensor substrate at a junction portion between the scintillator substrate and the sensor substrate.

The method may include, after the step of joining a scintillator substrate, fixing the sensor substrate and the scintillator substrate joined to each other so as to have curved surfaces to a curved-surface maintenance member having curvature identical to the curvature of the sensor substrate and the scintillator substrate in order to prevent separation between the scintillator substrate and the sensor substrate or deformation of the scintillator substrate and the sensor substrate at the junction portion between the scintillator substrate and the sensor substrate.

The junction layer may be made of a material that is melted by heat and is solidified at normal temperature.

The step of joining a scintillator substrate may include heating the junction layer so as to be melted in the state in which the scintillator substrate is disposed so as to overlap the sensor substrate.

The step of slimming a sensor substrate to a predetermined thickness may include sealing-treating a portion of the sensor substrate in which the photoelectric devices are mounted in order to prevent the photoelectric devices mounted in the sensor substrate from being exposed to a slimming medium configured to perform slimming.

The step of sealing-treating a portion of the sensor substrate in which the photoelectric devices are mounted may include disposing a protective member having tolerance to the slimming medium so as to overlap the sensor substrate and sealing outer edges of the sensor substrate and the protective member using a hermetic seal in the state in which the protective member overlaps the sensor substrate.

The step of seating the sensor substrate on a jig curved so as to have a curved-surface shape such that the sensor substrate is curved so as to have a curved-surface shape may include seating the sensor substrate on the jig in the state in which the protective member is attached to the sensor substrate and removing the protective member.

The step of joining a scintillator substrate may include attaching the scintillator substrate to the sensor substrate while moving pressurizing rollers from the middle to opposite ends of the scintillator substrate.

A curved-surface detector according to an embodiment of the present invention may be manufactured using the above manufacturing method.

Advantageous Effects

According to the present invention, a ready-made article of a sensor substrate is slimmed so as to be curved in the shape of a curved surface, and a scintillator substrate is joined to the sensor substrate, whereby it is possible to manufacture a curved-surface detector capable of minimizing distortion of a captured radiographic image, and the curved-surface detector is easy to manufacture and the manufacturing cost of the curved-surface detector is low, since the ready-made article of the sensor substrate is used.

In addition, the sensor substrate is sealing-treated before the sensor substrate is slimmed, whereby it is possible to prevent the sensor substrate from being damaged by a slimming medium used to perform slimming, and the sensor substrate is curved in the shape of a curved surface using a jig in the state in which a sensor substrate protection member is attached to the sensor substrate, whereby it is possible to disperse bending stress and thus to minimize damage to the sensor substrate.

In addition, a junction layer is made of a material that is melted by heat, whereby it is possible to maintain the shape of the sensor substrate curved in the shape of a curved surface as the result of solidification of the junction layer, and the junction layer is changed into a liquid phase and permeates into a gap between a scintillator substrate and the sensor substrate, whereby it is possible to minimize refraction of light and to minimize the thickness of the junction layer, and therefore it is possible to acquire a vivid radiographic image.

In addition, at the time of bonding the scintillator substrate to the sensor substrate, the scintillator substrate is attached to the sensor substrate while pressurizing rollers are moved from the middle to the opposite ends of the scintillator substrate, whereby it is possible to achieve rapid attachment therebetween and to minimize introduction of foreign matter.

DESCRIPTION OF REFERENCE NUMERALS

100: Curved-surface detector
110: Sensor substrate
111: Photoelectric devices
130: Scintillator substrate
150: Junction layer
170: Curved-surface maintenance member
210: Protective member
220: Hermetic seal
300: Jig
400: Pressurizing rollers

BEST MODE

Hereinafter, embodiments of the present invention will be described with reference to the accompanying drawings.

Figure 1:
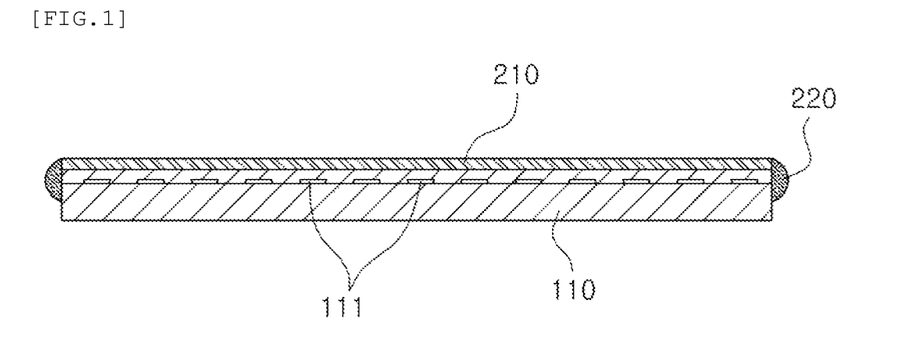
FIG. 1 is a view schematically showing the state in which a sensor substrate is sealing-treated before being slimmed in a method of manufacturing a curved-surface detector according to an embodiment of the present invention.
Figure 2:
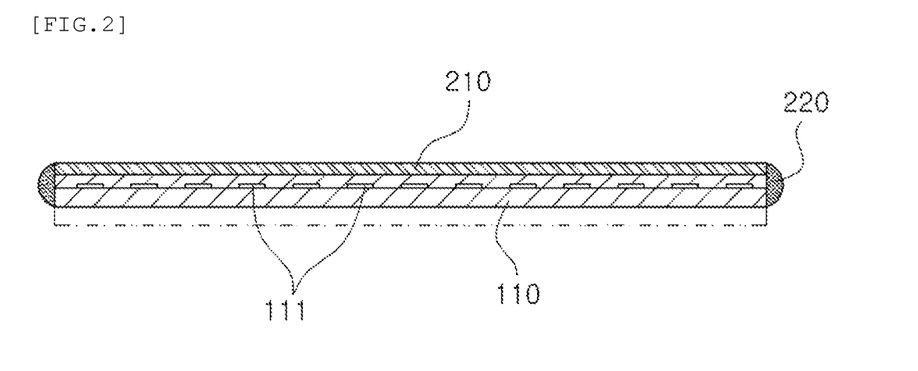
FIG. 2 is a view schematically showing the state in which the sensor substrate is slimmed in the method of manufacturing the curved-surface detector according to the embodiment of the present invention.

As shown in FIGS. 1 and 2, a method of manufacturing a curved-surface detector 100 according to an embodiment of the present invention may include a step of slimming a sensor substrate 110.

The sensor substrate 110 may be slimmed to a predetermined thickness such that the sensor substrate 110 can be easily curved due to the reduced thickness thereof.

Meanwhile, a ready-made article may be used as the sensor substrate 110 due to actual manufacturing cost of the sensor substrate 110 and an enlargement in facilities therefor, and the sensor substrate 110 may be configured to have a structure in which photoelectric devices 111 configured to capture a radiographic image are arranged in a glass substrate so as to be mounted therein.

Each of the photoelectric devices 111 may be a charge coupled device (CCD) or a complementary metal oxide semiconductor (CMOS) device configured to convert light into an electrical signal, the photoelectric devices 111 mounted in the glass substrate may be electrically connected to each other via a printed circuit electrode in order to transmit the photoelectrically transformed electrical signal.

Here, color filters may be installed at the photoelectric devices 111 in order to generate different electric signals depending on the color of incident light and thus to acquire an electrical signal of a color image, and the sensor substrate 110 may be realized by a thin film transistor (TFT) substrate.

Meanwhile, the portion of the sensor substrate 110 that is slimmed in order to reduce the thickness of the sensor substrate may be the portion of the glass substrate opposite the portion of the glass substrate in which the photoelectric devices 111 are mounted.

Here, at the time of slimming the sensor substrate 110, the sensor substrate may be slimmed such that the thickness of the sensor substrate is reduced using a chemical or mechanical method, and a slimming medium configured to perform slimming may be an etching solution used at the time of slimming using a chemical method or moisture (water) used at the time of mechanical abrasion.

As shown in FIG. 1, the step of slimming the sensor substrate 110 may include a step of performing sealing treatment.

In the step of performing sealing treatment, the portion of the sensor substrate 110 in which the photoelectric devices 111 are mounted may be sealing-treated in order to prevent the photoelectric devices 111 from being damaged by the slimming medium before the step of slimming the sensor substrate 110 is performed.

Meanwhile, the step of performing sealing treatment may be performed in a manner in which a portion or the entirety of the outer edge of the sensor substrate 110 is sealed using a hermetic seal 220 having tolerance to the slimming medium in the state in which a protective member 210 having tolerance to the slimming medium is disposed so as to overlap the sensor substrate 110.

Here, the protective member 210 may be formed so as to have the same size as the sensor substrate 110, the protective member 210 may be a panel having rigidity or a thin flexible film, and the protective member 210 may also perform a function of preventing dust generated at the time of mechanical abrasion from being introduced into the sensor substrate in addition to protection of the sensor substrate from the slimming medium.

Figure 3:
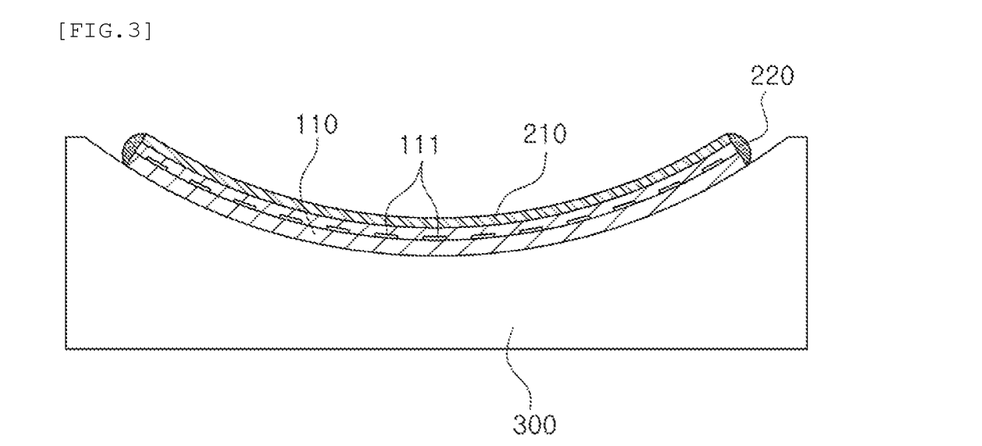
FIG. 3 is a side sectional view schematically showing the state in which the slimmed sensor substrate is curved by a jig in the method of manufacturing the curved-surface detector according to the embodiment of the present invention, which schematically shows the state before the sealing of the sensor substrate is removed.
Figure 4:
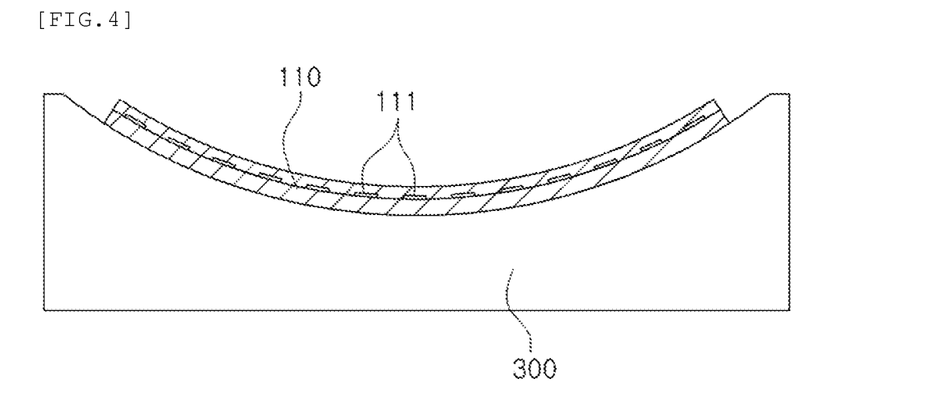
FIG. 4 is a side sectional view schematically showing the state in which the slimmed sensor substrate is curved by the jig in the method of manufacturing the curved-surface detector according to the embodiment of the present invention, which schematically shows the state after the sealing of the sensor substrate is removed.

As shown in FIGS. 3 and 4, the method of manufacturing the curved-surface detector 100 according to the embodiment of the present invention may include a step of curving the slimmed sensor substrate 110 in the form of a curved surface.

In the step of curving the slimmed sensor substrate 110 in the form of a curved surface, the sensor substrate 110 may be seated on a jig 300 having a predetermined curved surface in a desired form in order to curve the sensor substrate 110 in the form of a curved surface such that the sensor substrate 110 is curved along the curved surface of the jig 300.

The sensor substrate 110 may be seated on the jig 300 such that the portion of the sensor substrate in which the photoelectric devices 111 are mounted faces upwards, and the sensor substrate 110 may be seated on the jig 300 in the state in which the protective member 210 is not removed.

Here, at the time of seating the sensor substrate 110 on the jig 300 having the curved surface, the sensor substrate 110 may be curved, whereby bending stress may be applied to the glass substrate and thus the glass substrate may be damaged.

In order to prevent this, the sensor substrate 110 may be seated on the jig 300 in the state in which the protective member 210 is attached to the sensor substrate such that the protective member 210 or the hermetic seal 220 installed at the outer edge of the sensor substrate disperses the bending stress applied to the sensor substrate 110 in order to minimize damage to the sensor substrate 110.

Meanwhile, after the sensor substrate 110 is seated on the jig 300 and thus is curved in the form of a curved surface, the protective member 210 and the hermetic seal 220 may be removed from the sensor substrate 110.

Figure 5:
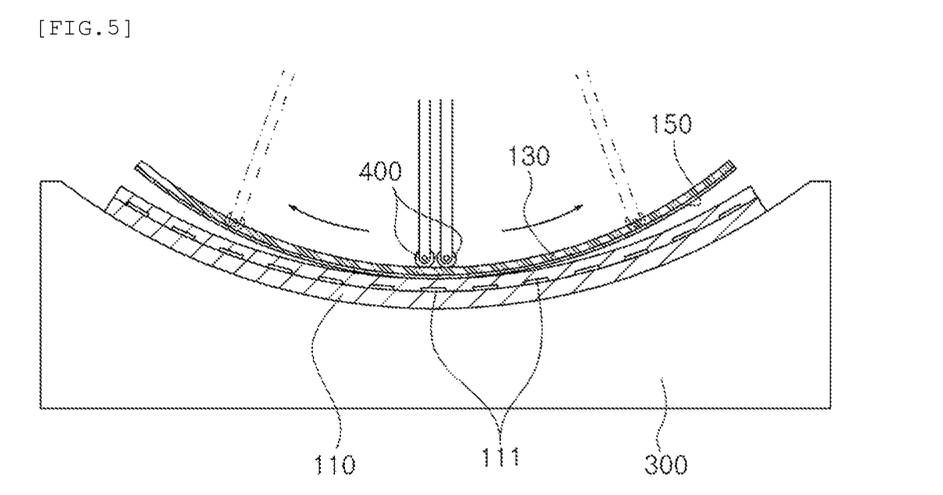
FIG. 5 is a view schematically showing the state in which a scintillator substrate is attached to the sensor substrate in the method of manufacturing the curved-surface detector according to the embodiment of the present invention.

As shown in FIG. 5, the method of manufacturing the curved-surface detector 100 according to the embodiment of the present invention may include a step of attaching a scintillator substrate 130 to the sensor substrate.

The scintillator substrate 130 may be made of a fluorescent material configured to emit light when struck by radiation, and the scintillator substrate 130 may be joined to the upper surface of the sensor substrate 110 curved in the form of a curved surface by the jig 300.

Meanwhile, the scintillator substrate 130 may be made of an inorganic or organic fluorescent material and may be made of NaI(Tl), ZnS(Ag), CsI(Tl), or LiI(Tl) depending on the wavelength of radiation, and the scintillator substrate 130 may have flexibility such that the scintillator substrate is flexibly curved and may be a scintillator substrate 130 as a ready-made article.

In addition, the scintillator substrate 130 may include a junction layer 150.

The junction layer 150 may be attached to the lower surface of the scintillator substrate 130, and the junction layer 150 may have an adhesive property and thus may join the scintillator substrate 130 to the sensor substrate 110 curved by the jig 300.

At this time, since the junction layer 150 joins the scintillator substrate 130 to the sensor substrate 110 in the state in which the scintillator substrate 130 is curved at curvature identical to the curvature of the sensor substrate 110 that is curved, the scintillator substrate 130 may maintain the curved state of the sensor substrate 110.

Meanwhile, at the time of attaching the scintillator substrate 130 to the sensor substrate 110, the middle of the sensor substrate 110 and the middle of the scintillator substrate 130 may be aligned with each other in the state in which the scintillator substrate 130 is curved such that the radius of curvature of the scintillator substrate 130 is less than the radius of curvature of the sensor substrate 110, the middle of the scintillator substrate 130 may be attached to the middle of the sensor substrate 110, and the scintillator substrate 130 may be attached to the sensor substrate under pressure while moving a pressurizing roller 400 configured to attach the scintillator substrate to the sensor substrate under pressure in directions toward opposite ends of the scintillator substrate.

Here, since a pair of pressuring rollers 400 attaches the scintillator substrate to the sensor substrate under pressure while moving from the middle of the scintillator substrate, which is the most concave, to the opposite ends of the curved surface, the scintillator substrate 130 may be rapidly attached to the sensor substrate 110, whereby it is possible to increase production speed. In addition, since attachment is rapidly performed, it is possible to minimize permeation of foreign matter into a gap between the scintillator substrate 130 and the sensor substrate 110.

Figure 6:
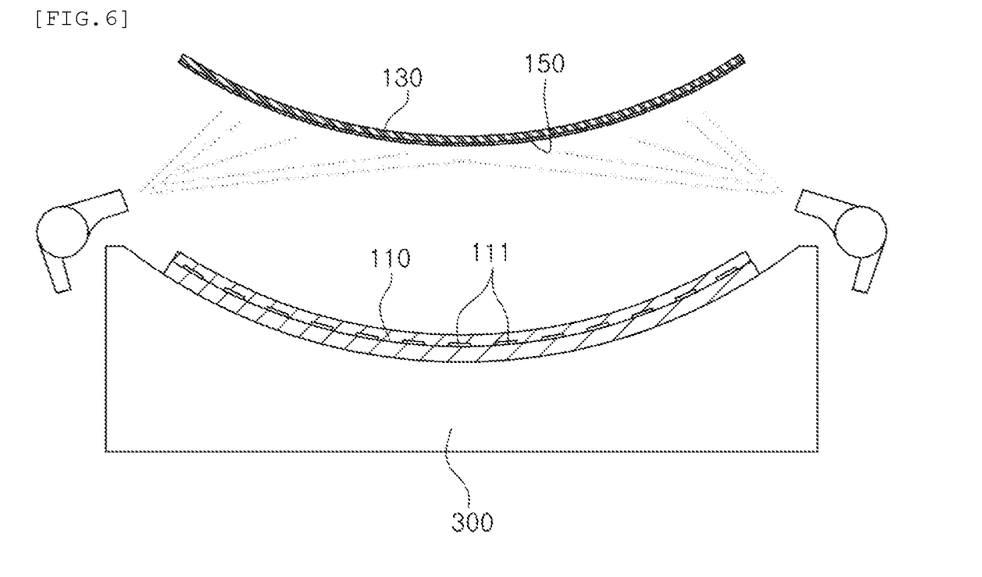
FIG. 6 is a view schematically showing the state in which heat treatment is performed in the case in which a junction layer is made of a melting material in the method of manufacturing the curved-surface detector according to the embodiment of the present invention.

As shown in FIG. 6, the junction layer 150 may be made of an optical material having light transmittance that is capable of being melted by heat, being solidified at normal temperature, and being maintained in shape in the solidified state thereof, and the glass transition temperature of the junction layer 150 may be lower than the glass transition temperature of the sensor substrate 110.

In addition, the junction layer 150 may be solidified in the state of being melted at the surface at which the scintillator substrate 130 is adhered to the sensor substrate 110 in the state in which the scintillator substrate 130 is curved at a radius of curvature identical to the radius of curvature of the sensor substrate 110 that is curved, whereby it is possible to maintain the state in which the scintillator substrate 130 is curved so as to have a curved surface.

In addition, heat treatment may be performed in order to heat the junction layer 150 such that the junction layer is melted, whereby the scintillator substrate 130 is joined to the sensor substrate 110, in the state in which the scintillator substrate 130 curved so as to have a curved surface overlaps the sensor substrate 110 curved so as to have a curved surface by the jig 300. At the time of heating, the junction layer may not be directly heated but may be indirectly heated using hot air in order to prevent damage to the photoelectric devices 111, a circuit, and the like.

Here, in the case in which the junction layer 150 is made of a material that is melted by heat and is solidified at normal temperature, the junction layer may be liquefied in the melted state and thus may permeate into the junction portion between the scintillator substrate 130 and the sensor substrate 110 without a gap in order to join the scintillator substrate 130 to the sensor substrate 110 at the junction portion without separation therebetween and deformation thereof, and the shape of the junction layer 150 may be maintained as the junction layer is solidified, whereby the curved shape of the sensor substrate 110 may be maintained even in the case in which the sensor substrate is separated from the sensor substrate 110.

Meanwhile, the junction layer 150 may be installed at the entirety of the lower surface of the scintillator substrate 130, or may be installed at the scintillator substrate 130 in the form of an arbitrary pattern capable of permeating into the gap between the scintillator substrate 130 and the sensor substrate 110 without generation of air bubbles.

In addition, a pollution prevention film may be attached to the outer surface of the junction layer 150, and the pollution prevention film may be removed from the junction layer at the time of attaching the scintillator substrate 130 to the sensor substrate 110, whereby it is possible to prevent foreign matter from being attached to the junction layer 150 and thus to prevent refraction of light due to the foreign matter at the time of melting the junction layer.

Figure 7:
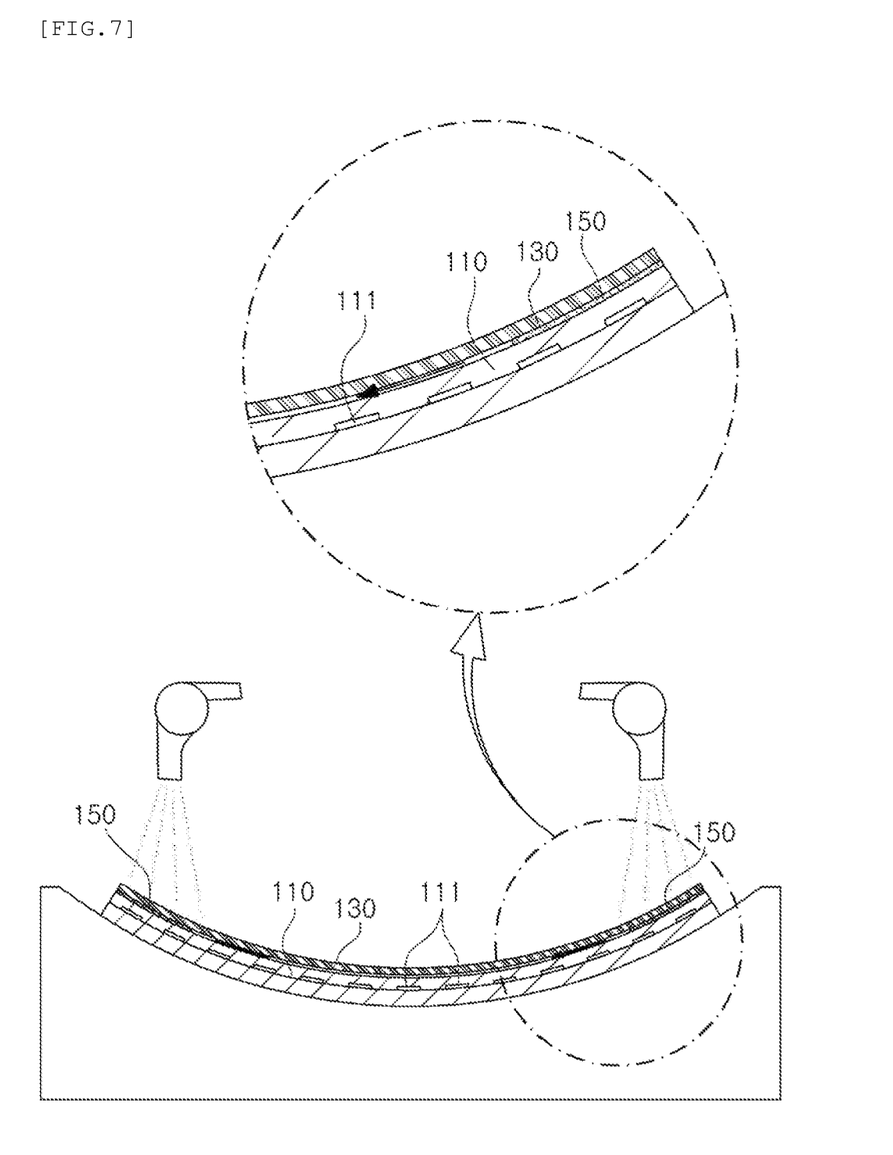
FIG. 7 is a view schematically showing the state in which the junction layer is installed at opposite ends of the scintillator substrate and heat treatment is performed in the method of manufacturing the curved-surface detector according to the embodiment of the present invention.

As shown in FIG. 7, as another example, the junction layer 150 may be installed at only opposite ends of the scintillator substrate 130 so as to have a predetermined width. When the junction layer 150 installed at the opposite ends of the scintillator substrate 130 is melted by heat, the junction layer may permeate into the gap between the scintillator substrate 130 and the sensor substrate 110 in the liquefied state while being diffused due to a capillary phenomenon, and at the same time may flow to the middle of the most concave portion of the curved surface to join the scintillator substrate 130 to the sensor substrate 110.

In the case in which the junction layer 150 is installed at opposite ends of the scintillator substrate 130 so as to permeate into the gap between the middle of the scintillator substrate and the middle of the sensor substrate at the time of being melted, as in the above example, it is possible to minimize the thickness of the junction layer 150, whereby it is possible to improve transmittance of light and thus to acquire an electrical signal of a vivid radiographic image.

Meanwhile, the junction layer 150 may be realized by an ultraviolet (UV) resin that is present in a liquid phase at normal temperature and is solidified when ultraviolet light is applied thereto.

Figure 8:
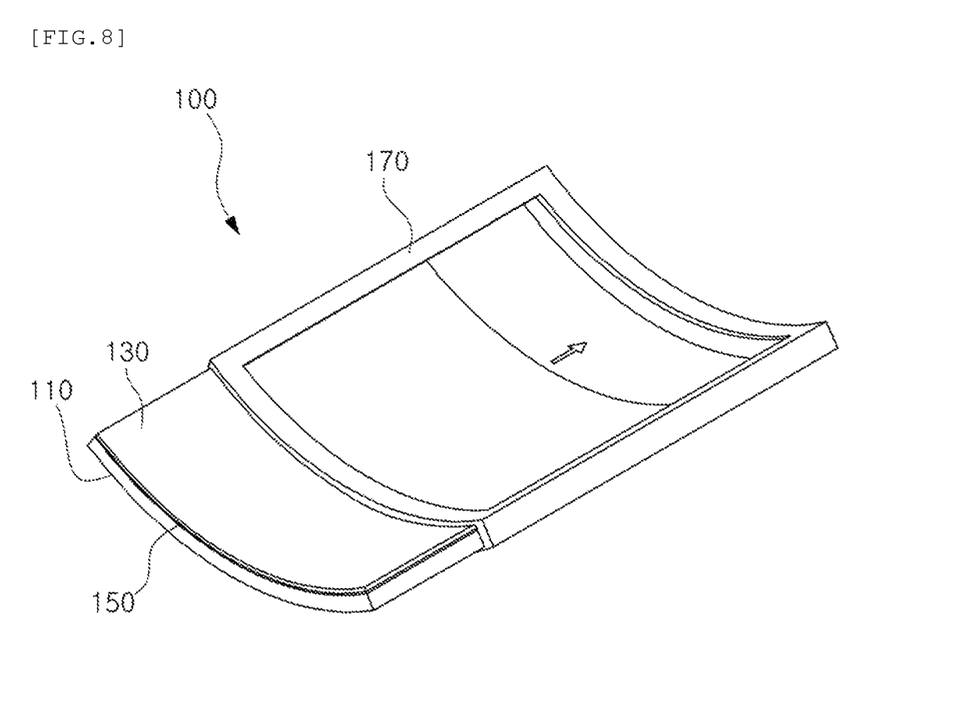
FIG. 8 is a perspective view showing a curved-surface detector manufactured using the method of manufacturing the curved-surface detector according to the embodiment of the present invention, which shows the state in which the curved-surface detector is fixed by a curved-surface maintenance member.

As shown in FIG. 8, the method of manufacturing the curved-surface detector 100 according to the embodiment of the present invention may include a step of fixing the sensor substrate and the scintillator substrate to a curved-surface maintenance member 170.

In the step of fixing the sensor substrate and the scintillator substrate to a curved-surface maintenance member 170, the sensor substrate 110 and the scintillator substrate 130 may be separated from the jig 300 in the state in which the sensor substrate 110 and the scintillator substrate 130 are joined to each other via the junction layer 150 and are curved in the shape of a curved surface, and the sensor substrate 110 and the scintillator substrate 130 may be fixed to the curved-surface maintenance member 170 such that the curved surfaces of the sensor substrate and the scintillator substrate are maintained.

Meanwhile, the curved-surface maintenance member 170 may be configured as follows. The sensor substrate 110 and the scintillator substrate 130 may be inserted into and fixed to a case formed so as to have curvature corresponding to the curvature of the sensor substrate 110 and the scintillator substrate 130 that are curved such that the curved surfaces of the sensor substrate and the scintillator substrate are maintained, or a frame or a panel formed so as to have curvature corresponding to the curvature of the sensor substrate 110 and the scintillator substrate 130 that are curved may be fixed or attached to one surface or each of the opposite surfaces of an assembly of the sensor substrate 110 and the scintillator substrate 130 joined to each other such that the curved surfaces of the sensor substrate and the scintillator substrate are maintained.

It is possible to manufacture the curved-surface detector 100 according to the embodiment of the present invention through a series of processes described above.

Hereinafter, the method of manufacturing the curved-surface detector 100 according to the embodiment of the present invention will be described briefly. In the state in which a protective member 210 is disposed on the surface of a sensor substrate 110 as a ready-made article in which photoelectric devices 111 are mounted in an overlapping fashion, a hermetic seal 220 is installed at the outer edges of the sensor substrate 110 and the protective member 210.

Subsequently, the sensor substrate 110 is seated on a jig 300 curved in the shape of a curved surface in the state in which the protective member 210 and the hermetic seal 220 are installed at the sensor substrate such that the sensor substrate is curved along the curved surface of the jig 300. At the time of seating the sensor substrate 110 on the jig 300, the sensor substrate is seated on the jig in the state in which the protective member 210 and the hermetic seal 220 are attached to the sensor substrate such that the protective member 210 and the hermetic seal 220 disperse the bending stress applied to the sensor substrate 110 in order to minimize damage to the slimmed sensor substrate 110.

After the sensor substrate 110 is seated on the jig 300, the hermetic seal 220 and the protective member 210 are removed from the sensor substrate 110, and a scintillator substrate 130 is joined to the sensor substrate 110 curved in the shape of a curved surface.

Meanwhile, at the time of joining the scintillator substrate 130 to the sensor substrate 110, the middle portion of the scintillator substrate 130 is joined to the middle portion of the sensor substrate 110 using pressurizing rollers 400 in the state in which the scintillator substrate 130 is curved such that the radius of curvature of the scintillator substrate 130 is less than the radius of curvature of the sensor substrate 110, and the scintillator substrate 130 is joined to the sensor substrate while moving the pressurizing rollers toward opposite ends of the scintillator substrate.

Here, in the case in which a junction layer 150 attached to the scintillator substrate 130 is made of a material that is melted by heat, the scintillator substrate 130 may be joined to the sensor substrate using the pressurizing rollers 400 in the state in which the junction layer 150 is melted by heat, or heat may be applied to the junction layer 150 such that the junction layer is melted in the state in which the scintillator substrate 130 is seated on the sensor substrate 110 in a curved state in order to join the scintillator substrate to the sensor substrate.

At this time, in the case in which the junction layer 150 is made of a material that is capable of being melted, the junction layer 150 is melted in a liquid phase and completely permeates into a gap between the scintillator substrate 130 and the sensor substrate 110 such that the scintillator substrate and the sensor substrate are joined to each other, whereby it is possible to minimize refraction of light and to minimize the thickness of the junction layer, and therefore it is possible to improve transmittance of light and thus to acquire an electrical signal of a vivid radiographic image.

Meanwhile, after the scintillator substrate 130 is joined to the sensor substrate 110, the sensor substrate 110, to which the scintillator substrate 130 is joined, is separated from the jig 300, a curved-surface maintenance member 170 is attached to the sensor substrate and the scintillator substrate, or the sensor substrate and the scintillator substrate are inserted into the curved-surface maintenance member 170 in order to permanently fix the scintillator substrate 130 and the sensor substrate 110 to each other such that the curvature of the scintillator substrate and the sensor substrate is not changed, whereby manufacture of the curved-surface detector 100 is completed.

In the method of manufacturing the curved-surface detector 100 according to the embodiment of the present invention and the curved-surface detector 100 manufactured using the manufacturing method, therefore, a ready-made article of the sensor substrate 110 is slimmed so as to be easily curved, and the scintillator substrate 130 is attached to the sensor substrate in the state of being curved in the shape of a curved surface, whereby it is possible to easily manufacture the curved-surface detector 100 and to reduce manufacturing cost.

In addition, at the time of slimming the sensor substrate 110, the sensor substrate 110 is sealing-treated, whereby it is possible to prevent the sensor substrate 110 from being damaged by the slimming medium.

In addition, the junction layer 150 configured to join the scintillator substrate 130 to the sensor substrate 110 is made of a material that is melted by heat and is solidified at normal temperature, whereby it is possible to maintain the state in which the sensor substrate 110 and the scintillator substrate 130 are curved, to minimize refraction of light, and to minimize the thickness of the junction layer 150, and therefore it is possible to improve transmittance of light and thus to acquire an electrical signal of a captured vivid radiographic image.

In addition, at the time of bonding the scintillator substrate 130 to the sensor substrate 110, the scintillator substrate is attached to the sensor substrate while the pressurizing rollers 400 are moved from the middle to the opposite ends of the scintillator substrate 130, whereby it is possible to achieve rapid and easy attachment therebetween and to minimize introduction of foreign matter.

In addition, the sensor substrate 110 and the scintillator substrate 130 are installed such that the curved surfaces of the sensor substrate and the scintillator substrate are maintained by the curved-surface maintenance member 170, whereby it is possible to minimize deformation in the curvature of the sensor substrate and the scintillator substrate.

Although the embodiment of the present invention has been described above, the scope of right of the present invention is not limited thereto and includes all alterations and modifications within a range easily changed and recognized as being equivalent by a person having ordinary skill in the art to which the present invention pertains from the embodiment of the present invention.

The invention claimed is:

1. A method of manufacturing a curved-surface detector in which a detector configured to convert radiation into an electrical signal in order to acquire a radiographic image is curved so as to have a curved-surface shape, the method comprising:
    slimming a sensor substrate having photoelectric devices arranged therein to a predetermined thickness;
    curving the sensor substrate by seating the sensor substrate slimmed to the predetermined thickness on a jig curved so as to have a curved-surface shape such that the sensor substrate is curved so as to have a curved-surface shape;
    after the step of curving the sensor substrate to have the curved-surface shape, joining a scintillator substrate that is flexible and configured to emit light when being struck by radiation to an upper surface of the sensor substrate such that curvature of the sensor substrate curved so as to have a curved-surface shape by the jig is maintained, wherein
    the scintillator substrate is joined to the sensor substrate via a junction layer in a state of being curved at curvature identical to curvature of the sensor substrate in order to maintain the curvature of the sensor substrate and thus to prevent separation between the scintillator substrate and the sensor substrate or deformation of the scintillator substrate and the sensor substrate at a junction portion between the scintillator substrate and the sensor substrate; and
    after the step of joining the scintillator substrate to the upper surface of the sensor substrate, separating the sensor substrate to which the scintillator substrate is joined from the jig.

2. The method according to claim 1, comprising:
    after the step of joining the scintillator substrate,
    fixing the sensor substrate and the scintillator substrate joined to each other so as to have curved surfaces to a curved-surface maintenance member having curvature identical to the curvature of the sensor substrate and the scintillator substrate in order to prevent separation between the scintillator substrate and the sensor substrate or deformation of the scintillator substrate and the sensor substrate at the junction portion between the scintillator substrate and the sensor substrate.

3. The method according to claim 1, wherein the junction layer is made of a material that is melted by heat and is solidified at normal temperature.

4. The method according to claim 3, wherein the step of joining the scintillator substrate comprises heating the junction layer so as to be melted in a state in which the scintillator substrate is disposed so as to overlap the sensor substrate.

5. The method according to claim 1, wherein the step of slimming the sensor substrate to a predetermined thickness comprises sealing-treating a portion of the sensor substrate in which the photoelectric devices are mounted in order to prevent the photoelectric devices mounted in the sensor substrate from being exposed to a slimming medium configured to perform slimming.

6. The method according to claim 5, wherein the step of sealing-treating a portion of the sensor substrate in which the photoelectric devices are mounted comprises:

disposing a protective member having tolerance to the slimming medium so as to overlap the sensor substrate; and sealing outer edges of the sensor substrate and the protective member using a hermetic seal in a state in which the protective member overlaps the sensor substrate.

7. The method according to claim 5, wherein the step of seating the sensor substrate on the jig curved so as to have a curved-surface shape such that the sensor substrate is curved so as to have a curved-surface shape comprises seating the sensor substrate on the jig in a state in which a protective member is attached to the sensor substrate and removing the protective member.

8. The method according to claim 1, wherein the step of joining the scintillator substrate comprises attaching the scintillator substrate to the sensor substrate while moving pressurizing rollers from a middle to opposite ends of the scintillator substrate.

9. A curved-surface detector manufactured using the method according to claim 1.

* * * * *